(12) United States Patent
Sato et al.

(10) Patent No.: US 8,072,714 B2
(45) Date of Patent: Dec. 6, 2011

(54) TUNNELING MAGNETORESISTANCE (TMR) DEVICE, ITS MANUFACTURE METHOD, MAGNETIC HEAD AND MAGNETIC MEMORY USING TMR DEVICE

(75) Inventors: Masashige Sato, Kawasaki (JP); Shinjiro Umehara, Kawasaki (JP); Takahiro Ibusuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/046,567

(22) Filed: Mar. 11, 2011

(65) Prior Publication Data

US 2011/0164448 A1 Jul. 7, 2011

Related U.S. Application Data

(62) Division of application No. 11/899,486, filed on Sep. 6, 2007, now abandoned.

(30) Foreign Application Priority Data

Nov. 14, 2006 (JP) ................................. 2006-307987

(51) Int. Cl.
*G11B 5/39* (2006.01)
(52) U.S. Cl. ................................. 360/324.2; 360/324.12
(58) Field of Classification Search ........ 360/324–324.2
See application file for complete search history.

(56) References Cited

U.S. PATENT DOCUMENTS

| | | | |
|---|---|---|---|
| 5,986,858 A | 11/1999 | Sato et al. | |
| 6,154,349 A * | 11/2000 | Kanai et al. | 360/324.12 |
| 6,165,287 A | 12/2000 | Sato et al. | |
| 6,181,537 B1 | 1/2001 | Gill | |
| 6,436,526 B1 | 8/2002 | Odagawa et al. | |
| 6,674,617 B2 | 1/2004 | Gill | |
| 6,977,181 B1 * | 12/2005 | Raberg | 438/3 |
| 7,081,658 B2 | 7/2006 | Worledge et al. | |
| 7,116,533 B2 | 10/2006 | Seyama et al. | |
| 7,246,427 B2 | 7/2007 | Guo et al. | |
| 7,262,064 B2 | 8/2007 | Ohba et al. | |
| 7,304,359 B2 | 12/2007 | Kim et al. | |

(Continued)

FOREIGN PATENT DOCUMENTS

JP 2871670 3/1999

(Continued)

OTHER PUBLICATIONS

Yuasa et at.; "Giant Room-Temperature Magnetoresistance in Single-Crystal Fe/MgO/Fe Magnetic Tunnel Junctions"; Nature Materials, vol. 3; Dec. 2004; pp. 868-871.

(Continued)

*Primary Examiner* — Will J Klimowicz
(74) *Attorney, Agent, or Firm* — Fujitsu Patent Center

(57) ABSTRACT

A barrier layer is disposed over a pinned layer made of ferromagnetic material having a fixed magnetization direction, the barrier layer having a thickness allowing electrons to transmit therethrough by a tunneling phenomenon. A first free layer is disposed over the barrier layer, the first free layer being made of amorphous or fine crystalline soft magnetic material which changes a magnetization direction under an external magnetic field. A second free layer is disposed over the first free layer, the second free layer being made of crystalline soft magnetic material which changes a magnetization direction under an external magnetic field and being exchange-coupled to the first free layer. A tunneling magnetoresistance device is provided which has good magnetic characteristics and can suppress a tunnel resistance change rate from being lowered.

6 Claims, 10 Drawing Sheets

U.S. PATENT DOCUMENTS

| | | | |
|---|---|---|---|
| 7,379,279 B2 * | 5/2008 | Noma | 360/324.11 |
| 7,595,520 B2 | 9/2009 | Horng et al. | |
| 7,663,848 B1 * | 2/2010 | Huai et al. | 360/324.2 |
| 7,746,602 B2 | 6/2010 | Gill | |
| 7,746,603 B2 | 6/2010 | Gill | |
| 7,751,156 B2 | 7/2010 | Mauri et al. | |
| 7,760,474 B1 * | 7/2010 | Huai et al. | 360/324.12 |
| 7,791,845 B2 | 9/2010 | Mauri et al. | |
| 7,800,868 B2 | 9/2010 | Gao et al. | |
| 2003/0169542 A1 | 9/2003 | Gill | |
| 2004/0229430 A1 | 11/2004 | Findeis et al. | |
| 2004/0257719 A1 | 12/2004 | Ohba et al. | |
| 2005/0110004 A1 | 5/2005 | Parkin et al. | |
| 2005/0185454 A1 * | 8/2005 | Brown et al. | 365/171 |
| 2005/0282295 A1 * | 12/2005 | Raberg | 438/3 |
| 2007/0281079 A1 * | 12/2007 | Carey et al. | 427/131 |
| 2008/0080101 A1 * | 4/2008 | Mauri et al. | 360/324.2 |
| 2008/0186638 A1 * | 8/2008 | Nishimura et al. | 360/324.2 |
| 2009/0325319 A1 | 12/2009 | Horng et al. | |

FOREIGN PATENT DOCUMENTS

| | | |
|---|---|---|
| JP | 2001-068760 A | 3/2001 |
| JP | 2003-304012 A | 10/2003 |

OTHER PUBLICATIONS

Parkin et al.; "Giant Tunnelling Magnetoresistance at Room Temperature with MgO (100) Tunnel Barriers"; Nature Materials. vol. 3; Dec. 2004; pp. 862-867.

USPTO (Klimowicz) CTRS-Requirement for Election/Restriction mailed Oct. 18, 2010, in connection with U.S. Appl. No. 11/899,486.

USPTO (Klimowicz) CTNF-Non-Final Office Action mailed Nov. 8, 2010, in connection with U.S. Appl. No. 11/899,486.

USPTO (Klimowicz) NTC.A.NONCPL-Notice to the Applicant Regarding a Non-Responsive or Non-Compliant Amendment mailed Feb. 9, 2011, in connection with U.S. Appl. No. 11/899,486.

U.S. Appl. No. 11/899,486, filed Sep. 6, 2007, Klimowicz, William Joseph.

Japanese Office Action mailed Aug. 9, 2011 for corresponding Japanese Application No. 2006-307987, with English-language translation.

* cited by examiner

- 35 Ta
- 32 Ni90Fe10
- 30 CoFeB
- 25 MgO
- 22 CoFeB
- 21 Ru
- 20 CoFe
- 18 IrMn

- 35 Ta
- 32 Ni90Fe10
- 30 CoFeB
- 25 MgO
- 22 CoFeB
- 21 Ru
- 20 CoFe
- 18 IrMn

TUNNELING MAGNETORESISTANCE (TMR) DEVICE, ITS MANUFACTURE METHOD, MAGNETIC HEAD AND MAGNETIC MEMORY USING TMR DEVICE

CROSS REFERENCE TO RELATED APPLICATION

This application is based on and claims priority of Japanese Patent Application No. 2006-307987 filed on Nov. 14, 2006; and is a Divisional of prior U.S. application Ser. No. 11/899,486 filed on Sep. 6, 2007, now abandoned, the entire contents of which are incorporated herein by reference.

BACKGROUND OF THE INVENTION

A) Field of the Invention

The present invention relates to a tunneling magnetoresistance device and its manufacture method, and more particularly to a tunneling magnetoresistance device which changes its electric resistance depending on an external magnetic field and is applied to a reproducing head of a magnetic recording apparatus and a magnetic memory, and its manufacture method.

B) Description of the Related Art

In a junction having a "metal/insulating film/metal" structure consisting of the insulating film and metal films sandwiching the insulating film therebetween, as a voltage is applied across opposing metal layers, a small current flows if the insulating film is sufficiently thin. Generally, current does not flow through an insulating film. However, if the insulating film is sufficiently thin, e.g., several nm or thinner, electrons transmit through the insulating film at some probability because of the quantum mechanics effects. Current of electrons transmitting through an insulating film is called a "tunnel current" and its structure is called a "tunnel junction".

Generally, a metal oxide film is used as the insulating film of the tunnel junction. For example, a thin insulating film of aluminum oxide is formed by natural oxidation, plasma oxidation or thermal oxidation of a surface layer of aluminum. By controlling oxidation conditions, an insulating film can be formed which is applicable to the tunnel junction and has a thickness of several nm.

A device having a tunnel junction exhibits nonlinear current-voltage characteristics and has been used as a nonlinear device.

The structure of the tunnel junction whose opposing metal layers are made of ferromagnetic material is called a "ferromagnetic tunnel junction". A tunnel probability (tunnel resistance) of a ferromagnetic tunnel junction is dependent upon a magnetization state of opposing ferromagnetic materials. Therefore, the tunnel resistance can be changed by controlling the magnetization state by applying an external magnetic field. A tunnel resistance R can be expressed by the following equation:

$$R=Rs+0.5\Delta R(1-\cos\theta)$$

where $\theta$ is a relative angle between magnetization directions of opposing ferromagnetic materials. Rs represents a tunnel resistance at the magnetization direction relative angle $\theta$ of 0, i.e., at parallel magnetization directions, and $\Delta R$ represents a difference between tunnel resistances at the magnetization direction relative angle $\theta$ of 180°, i.e., at counter-parallel magnetization directions and the tunnel resistance at the parallel magnetization directions.

A phenomenon that a tunnel resistance changes depending on a magnetization direction of ferromagnetic material results from polarization of electrons in ferromagnetic material. Generally, there exist in metal, spin-up electrons in an upward spin state and spin-down electrons in a downward spin state. There exist in nonmagnetic metal, the same number of spin-up electrons and spin-down electrons. Therefore, no magnetism is exhibited as a whole. In ferromagnetic material, the number of spin-up electrons (Nup) is different from the number of spin-down electrons (Ndown) so that the ferromagnetic material exhibits spin-up or spin-down magnetism as a whole.

It is known that when an electron transmits through a barrier layer by the tunnel phenomenon, the spin state of the electron is retained. Therefore, if there is a vacant electron quantum level in a tunnel destination ferroelectric material, an electron can transmit through the barrier layer. If there is no vacant electron quantum level, an electron cannot transmit through the barrier layer.

A change rate $\Delta R/Rs$ of a tunnel resistance is expressed by the following equation:

$$\Delta R/Rs=2P_1P_2/(1-P_1P_2)$$

wherein $P_1$ and $P_2$ are spin polarizabilities of ferroelectric material on both sides of a barrier layer. The spin polarizability is given by the following equation:

$$P=2(Nup-Ndown)/(Nup+Ndown)$$

Tunneling magnetoresistance devices are reported in "Japanese Patent Publication No. 2871670", "Yuasa et al., Nature Materials vol. 3 (2004) p. 868-p. 871", "Parkin et al., Nature Materials vol. 3 (2004) p. 862-p. 867", and "Tsunekawa et al., Effect of Capping Layer Material on Tunnel Magnetoresistance in CoFeB/MgO/CoFeB magnetic Tunnel Junctions, International Magnetic Conference 2005, HP-08, p. 992".

SUMMARY OF THE INVENTION

Magnetic characteristics of a tunneling magnetoresistance device are improved. A tunnel resistance change rate of a tunneling magnetoresistance device can be suppressed from being lowered. Further, a manufacture method for such a tunneling magnetoresistance device is provided.

According to one aspect of the present invention, there is provided a tunneling magnetoresistance device including:

a pinned layer made of ferromagnetic material having a fixed magnetization direction;

a barrier layer disposed over the pinned layer and having a thickness allowing electrons to transmit therethrough by a tunneling phenomenon;

a first free layer disposed over the barrier layer and made of amorphous or fine crystalline soft magnetic material which changes a magnetization direction under an external magnetic field; and a second free layer disposed over the first free layer and made of crystalline soft magnetic material which changes a magnetization direction under an external magnetic field and being exchange-coupled to the first free layer.

According to another aspect of the present invention, there is provided a method for manufacturing a tunneling magnetoresistance device, including steps of:

(a) forming a pinning layer made of antiferromagnetic material on a support substrate;

(b) forming a pinned layer over the pinning layer, the pinned layer being made of ferromagnetic material whose magnetization direction is fixed by an exchange interaction with the pinning layer;

(c) forming a barrier layer over the pinned layer, the barrier layer having a thickness allowing electrons to transmit therethrough by a tunneling phenomenon;

(d) forming a first free layer made of amorphous or fine crystalline soft magnetic material over the barrier layer;

(e) exposing a surface of the first free layer to nitrogen plasma;

(f) forming a second free layer made of crystalline soft magnetic material over the first free layer exposed to the nitrogen plasma; and (g) conducting a regularizing heat treatment process for the pinning layer by disposing a lamination structural body between the support substrate and the second free layer in a magnetic field.

According to still another aspect of the present invention, there is provided a method for manufacturing a tunneling magnetoresistance device, including steps of:

(a) forming a pinning layer made of antiferromagnetic material on a support substrate;

(b) forming a pinned layer over the pinning layer, the pinned layer being made of ferromagnetic material whose magnetization direction is fixed by an exchange interaction with the pinning layer;

(c) forming a barrier layer over the pinned layer, the barrier layer having a thickness allowing electrons to transmit therethrough by a tunneling phenomenon;

(d) forming a first free layer made of amorphous or fine crystalline soft magnetic material over the barrier layer;

(e) forming a crystallization suppressing layer over the first free layer;

(f) forming a second free layer made of crystalline soft magnetic material over the crystallization suppressing layer; and (g) conducting a regularizing heat treatment process for the pinning layer by disposing a lamination structural body between the support substrate and the second free layer in a magnetic field, wherein the crystallization suppressing layer suppressing the first free layer from being crystallized by inheriting a crystal structure of the second free layer during the step (g).

According to still another aspect of the present invention, there is provided a magnetic head provided with the tunneling magnetoresistance device.

According to still another aspect of the present invention, there is provided a magnetic memory including:

the tunneling magnetoresistance device;

recording means for applying a magnetic field to the tunneling magnetoresistance device to change magnetization directions of first and second free layers of the tunneling magnetoresistance device; and reproducing means for applying a sense current through the tunneling magnetoresistance device to detect a resistance of the tunneling magnetoresistance device.

DESCRIPTION OF THE PREFERRED EMBODIMENTS

A tunneling magnetoresistance device consisting of a CoFeB/MgO/CoFeB lamination structure is explained below prior to describing embodiments.

Figure 9A:
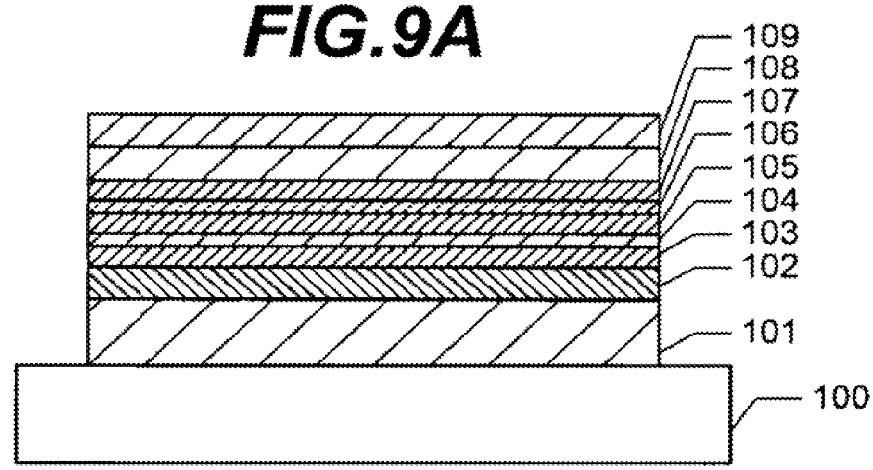
FIG. 9A is a cross sectional view of a tunneling magnetoresistance device consisting of a CoFeB/MgO/CoFeB lamination structure.

FIG. 9A shows an example of a tunneling magnetoresistance device consisting of a CoFeB/MgO/CoFeB lamination structure. An underlying layer 101 of Ta having a thickness of 50 nm, a pinning layer 102 of PtMn having a thickness of 15 nm, a first pinned layer 103 of CoFe having a thickness of 3 nm, a non-magnetic coupling layer 104 of Ru having a thickness of 0.8 nm, a second pinned layer 105 of CoFeB having a thickness of 3 nm, a barrier layer 106 of MgO having a thickness of 2 nm, a free layer 107 of CoFeB having a thickness of 3 nm, a first cap layer 108 of Ta having a thickness of 10 nm and a second cap layer 109 of Ru having a thickness of 10 nm are formed in this order on a support substrate 100 made of Si or $SiO_2$.

Figure 9B:
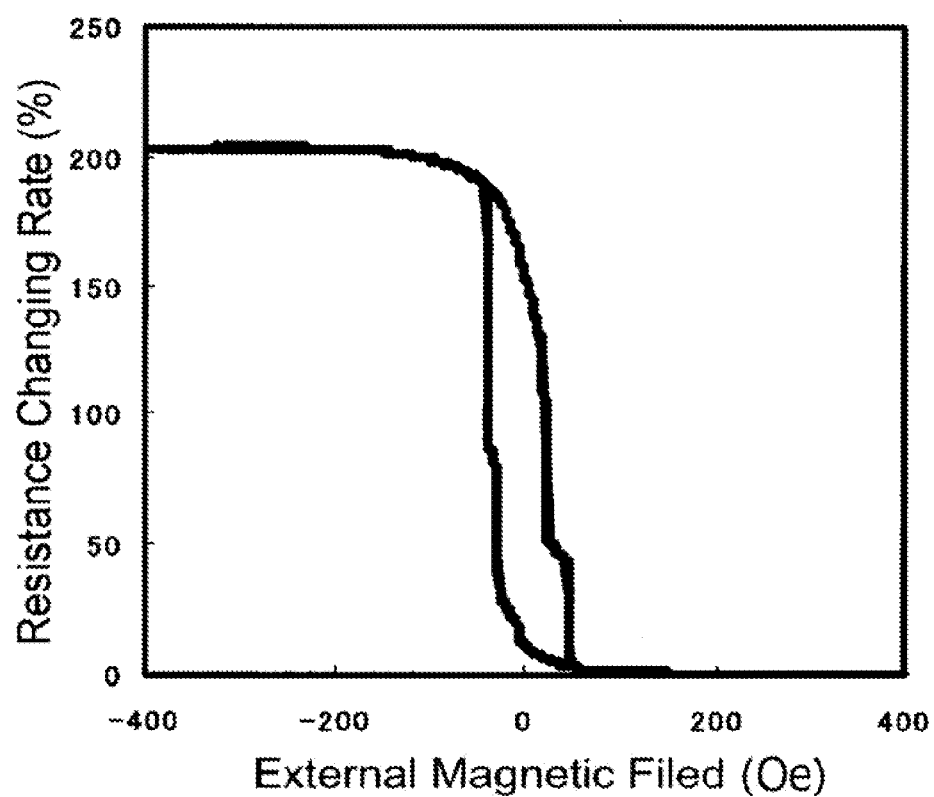
FIG. 9B is a graph showing the relation between a resistance change rate and an applied magnetic field.

FIG. 9B shows a relation between an external magnetic field and a resistance change rate. A resistance change rate is defined by $(R-Rs)/Rs$ where Rs is a device resistance when a magnetization direction of the pinned layers 103 and 105 is parallel to a magnetization direction of the free layer 107, and R is a device resistance when an external magnetic field is applied. It can be seen that the maximum resistance change rate of about 200% is obtained.

When a tunneling magnetoresistance device is applied to a magnetic head, it is required to have desired magnetic characteristics, that is magnetization characteristics, magnetostriction characteristics, coercive force, magnetic anisotoropy and the like. For example, it can be known from the measurement results shown in FIG. 9B that a magnetic field (coercive force) of about 50 Oe is required to reverse magnetization of the free layer 107 of the tunneling magnetoresistance device. In order to apply the device to a magnetic head, it is necessary to lower the coercive force. An effective coercive force can be lowered by stacking soft magnetic material having a smaller coercive force than CoFeB on the free layer 107 made of CoFeB.

If a layer of soft magnetic material having a small coercive force such as NiFe is stacked on the free layer of CoFeB, a resistance change rate lowers.

A first embodiment is described below.

Figure 1A:
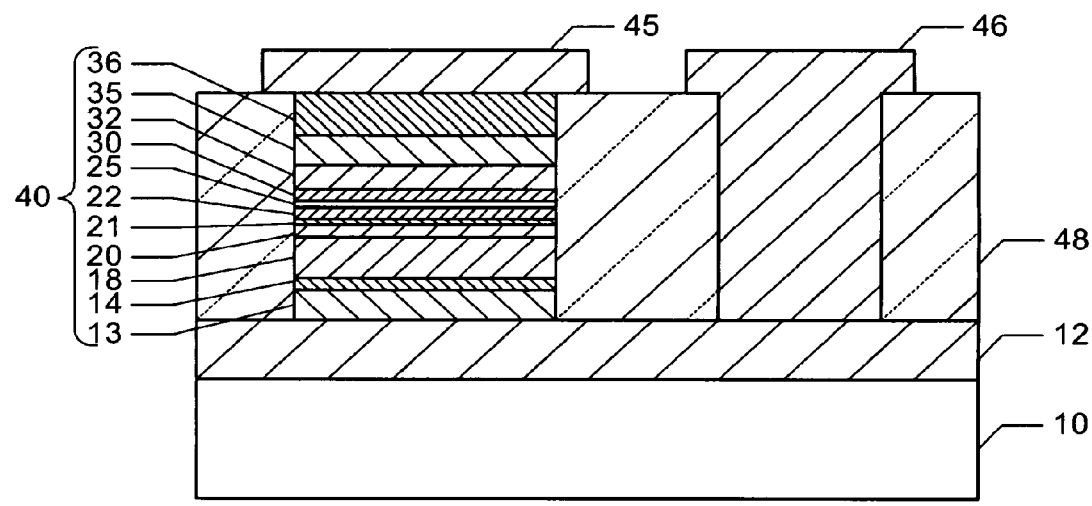
FIGS. 1A and 1B are a cross sectional view and a plan view of a tunneling magnetoresistance device according to a first embodiment.
Figure 1B:
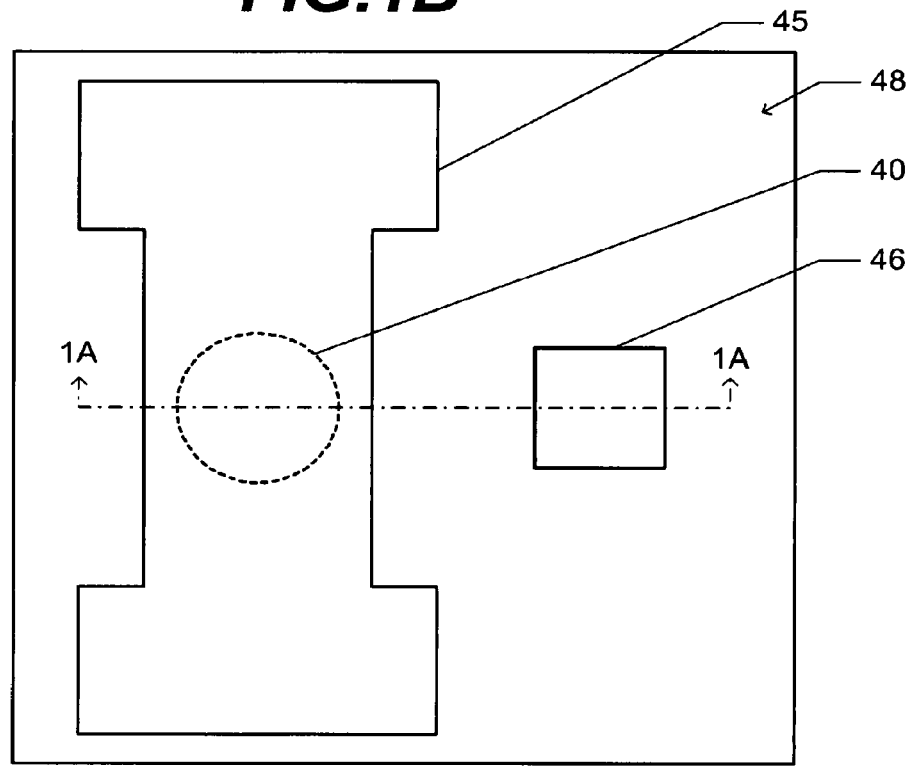

FIGS. 1A and 1B are a cross sectional view and a plan view of a tunneling magnetoresistance device according to the first embodiment. FIG. 1A corresponds to a cross sectional view taken along one-dot chain line 1A-1A of FIG. 1B.

As shown in FIG. 1A, a conductive layer 12 of NiFe is formed on a support substrate 10 having an $SiO_2$ film formed on Si. Other materials such as ceramic material such as AlTiC, and quartz glass may be used as the material of the support substrate 10. The surface of the NiFe conductive layer 12 is planarized by chemical mechanical polishing (CMP). A tunneling magnetoresistance device 40 of a cylindrical shape is formed on a partial area of the conductive layer 12.

The tunneling magnetoresistance device 40 is formed by laminating a first underlying layer 13, a second underlying layer 14, a pinning layer 18, a first pinned layer 20, a non-magnetic coupling layer 21, a second pinned layer 22, a barrier layer 25, a first free layer 30, a second free layer 32, a first cap layer 35 and a second cap layer 36 in this order.

The first underlying layer 13 is made of Ta and has a thickness of about 5 nm. The first underlying layer 13 may be made of Cu or Au, or may be a lamination layer of these materials. The second underlying layer 14 is made of Ru and has a thickness of about 2 nm.

The pinning layer 18 is made of IrMn and has a thickness of about 7 nm. The pinning layer 18 may be made of antiferromagnetic material other than IrMn, such as alloy of Mn and at least one element selected from a group consisting of Pt, Pd, Ni, Ir and Rh. A thickness of the pinning layer 18 is preferably in a range between 5 nm and 30 nm, and more preferably in a range between 10 nm and 20 nm. The pinning layer 18 is regularized by heat treatment in a magnetic field after it is deposited, and exhibits antiferromagnetism.

The first pinned layer 20 is made of $Co_{74}Fe_{26}$ and has a thickness of, e.g., 2 nm. The non-magnetic coupling layer 21 is made of Ru and has a thickness of, e.g., 0.8 nm. The second pinned layer 22 is made of $Co_{60}Fe_{20}B_{20}$ and has a thickness of, e.g., 2 nm. A magnetization direction of the first pinned layer 20 is fixed to a certain direction by an exchange interaction with the pinning layer 18. Namely, the magnetization direction of the first pinned layer 20 does not change even if an external magnetic field is applied if the magnetic field intensity is weaker than the exchange interaction. The first pinned layer 20 and second pinned layer 22 exchange-couple antiferromagnetically with each other via the non-magnetic coupling layer 21.

A thickness of the non-magnetic coupling layer 21 is set in a range allowing that the first pinned layer 20 and second pinned layer 22 exchange-couple antiferromagnetically with each other. The thickness is in a range between 0.4 nm and 1.5 nm, and preferably between 0.4 nm and 0.9 nm. The first pinned layer 20 and second pinned layer 22 may be made of ferromagnetic material which contains one of Co, Ni and Fe. The non-magnetic coupling layer 21 may be made of non-magnetic material such as Rh, Ir, Ru-based alloy, Rh-based alloy and Ir-based alloy, in addition to Ru. Alloy containing Ru and at least one element selected from a group consisting of Co, Cr, Fe, Ni and Mn may be cited as an example of the Ru-based alloy.

The magnetization direction of the first pinned layer 20 and the magnetization direction of the second pinned layer 22 are counter-parallel so that an intensity of a net leakage magnetic field from the first and second pinned layers 20 and 22 lowers. This mitigates the adverse effect that the leakage magnetic field changes the magnetization directions of the first and second free layers 30 and 32. Accordingly, magnetization of the first and second free layers 30 and 32 can respond correctly to a leakage magnetic field from a magnetic recording medium, and detection accuracy for magnetization recorded in the magnetic recording medium is improved.

The barrier layer 25 is made of MgO and has a thickness of, e.g., 1.0 nm. It is preferable that MgO of the barrier layer 25 is crystalline, and it is particularly preferable that the (001) plane of MgO is oriented generally in parallel to the substrate surface. A thickness of the barrier layer 25 is preferably in a range between 0.7 nm and 2.0 nm from the viewpoint of good film quality. The barrier layer 25 may be made of $AlO_x$, $TiO_x$, $ZrO_x$, AlN, TiN, ZrN or the like, in place of MgO. If the barrier layer 25 is made of material other than MgO, its thickness is preferably in a range between 0.5 nm and 2.0 nm, and more preferably in a range between 0.7 nm and 1.2 nm.

The first free layer 30 is made of amorphous $Co_{60}Fe_{20}B_{20}$ and has a thickness of about 2 nm. From the viewpoint that the first free layer 30 is easy to be amorphous, a B concentration is preferably in a range between 10 atom % and 25 atom %. The first free layer 30 may be made of soft magnetic material added with at least one element selected from a group consisting of B, C, Al, Si and Zr, in place of CoFeB.

The second free layer 32 is made of $Ni_{80}Fe_{20}$ and has a thickness of, e.g., 4 nm. The second free layer 32 is made of soft magnetic material having a smaller coercive force than that of the first free layer 30. CoNiFe having a composition allowing a face centered cubic structure may be cited as an example of the material of the second free layer 32, in place of NiFe. At least one element selected from a group consisting of B, C, Al, Si and Zr may be added to NiFe and CoNiFe. A concentration of the added element is set lower than that of the element added to the first free layer 30.

By ferromagnetically coupling the second free layer 32 having a smaller coercive force to the first free layer 30, sensitivity to a change in the external magnetic field can be improved. Generally, a ferromagnetic film is more sensitive to a change in the direction of an external magnetic field, the smaller the coercive force is. Since the coercive force of the second free layer 32 is lower than that of the first free layer 30, as the direction of an external magnetic field changes, the magnetization direction of the second free layer 32 changes before the magnetization direction of the first free layer 30 changes. Since the first free layer 30 is ferromagnetically exchange-coupled to the second free layer 32, the magnetization direction of the first free layer 30 changes following a change in the magnetization direction of the second free layer 32. Therefore, the magnetization direction of the first free layer 30 is more susceptible to a change in the direction of an external magnetic field. Since the magnetization direction of the first free layer 30 contributes to the resistance change rate, a sensitivity of the tunneling magnetoresistance device can be improved by disposing the second free layer 32.

The first cap layer 35 is made of Ta and has a thickness of, e.g., 5 nm. The second cap layer 36 is made of Ru and has a thickness of, e.g., 10 nm. The first cap layer 35 and second cap layer 36 prevent the underlying ferromagnetic layer and the like from being oxidized during heat treatment. The first cap layer 35 may be made of Ru, and the second cap layer 36 may be made of Ta. More generally, the cap layer may be made of non-magnetic metal such as Au, Ta, Al, W and Ru, or may be made of a lamination structure of layers made of these metals. A total thickness of the cap layers is preferably in a range between 5 nm and 30 nm.

Of the surface of the conductive layer 12, the region where the tunneling magnetoresistance device 40 is not disposed is covered with an insulating film 48 of insulating material such as $SiO_2$. A first electrode 45 is formed on the tunneling magnetoresistance device 40 and insulating film 48. The first electrode 45 is electrically connected to the second cap layer 36. A via hole is formed through the insulating film 48, reaching the conductive layer 12. The via hole is filled with a second electrode 46. The second electrode 46 is electrically connected to the conductive layer 12. The first electrode 45 and second electrode 46 are made of, e.g., Cu.

Next, with reference to FIGS. 2A to 2D, description will be made on a manufacture method for the tunneling magnetoresistance device of the first embodiment.

Figure 2A:
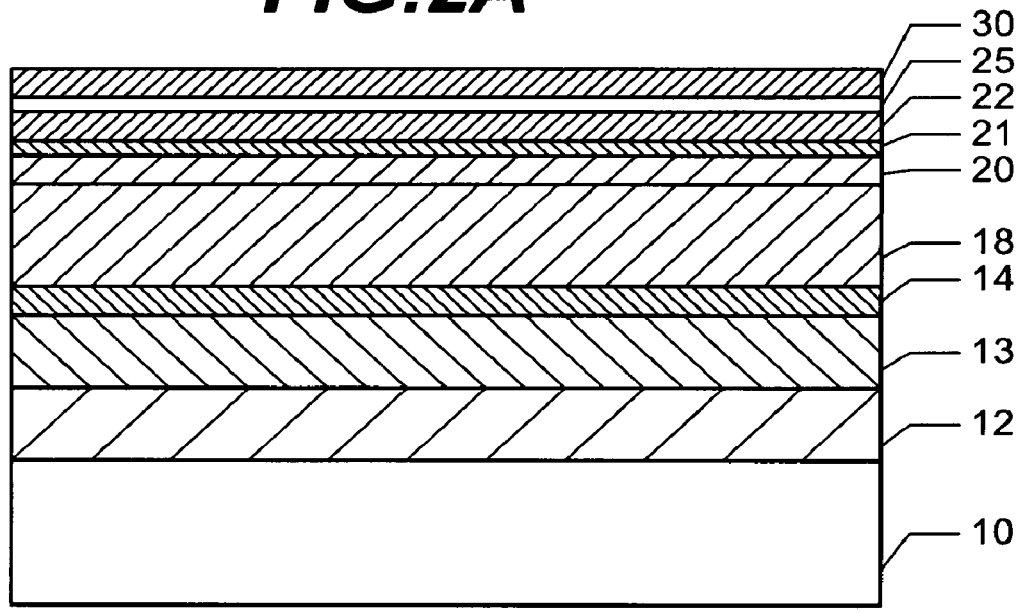
FIGS. 2A to 2D are cross sectional views of the tunneling magnetoresistance device during manufacture of the first embodiment.

As shown in FIG. 2A, the layers from the conductive layer 12 to first free layer 30 are formed on the support substrate 10 by using a magnetron sputtering system.

Figure 2B:
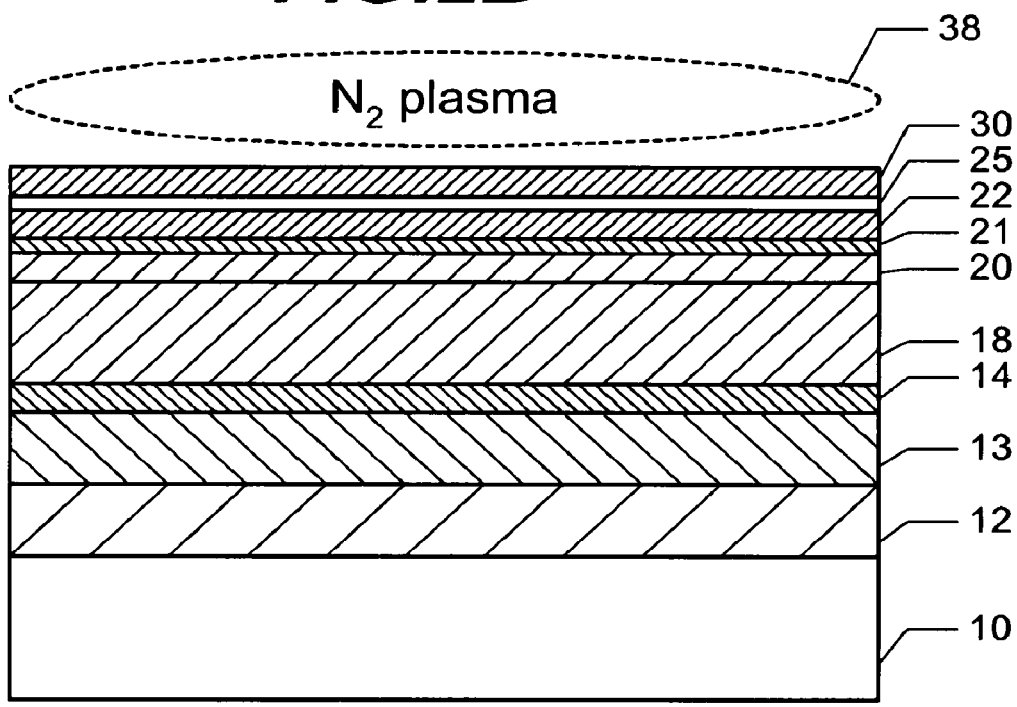

As shown in FIG. 2B, the first free layer 30 is exposed to nitrogen plasma 38. For example, this plasma process is executed under the following conditions:

Nitrogen gas flow rate: 100 sccm
RF power: 50 W
Process time: 30 sec

Figure 2C:
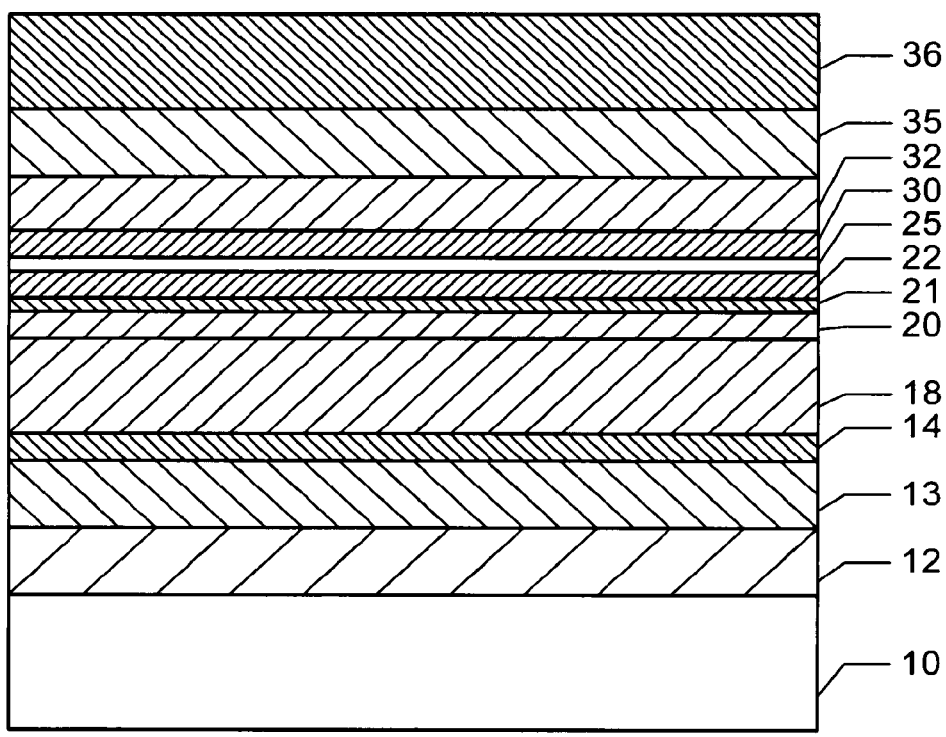

As shown in FIG. 2C, the second free layer 32, first cap layer 35 and second cap layer 36 are formed on the first free layer 30 subjected to the surface treatment by nitrogen plasma, by using the magnetron sputtering system. Thereafter, the substrate is disposed in vacuum and a regularizing heat treatment process is performed for the pinning layer 18, in the state that a magnetic field is applied. A heat treatment temperature is, e.g., 270° C. and a heat treatment time is, e.g., four hours. The heat treatment temperature may be in a range between 250° C. and 400° C.

Figure 2D:
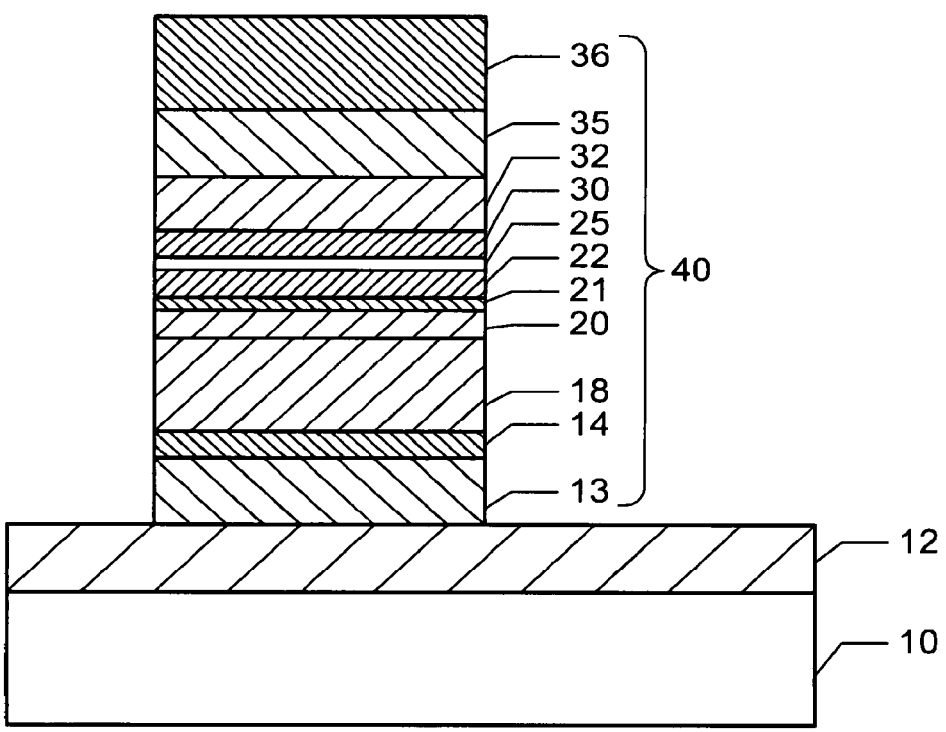

As shown in FIG. 2D, the layers between the first underlying layer 13 and the second cap layer 36 are patterned to form the tunneling magnetoresistance device 40 of a cylindrical shape. Patterning these layers may be performed by Ar ion milling. Thereafter, as shown in FIG. 1A, the insulating film 48, first electrode 45, via hole through the insulating film 48 and second electrode 46 are formed.

Figure 3A:
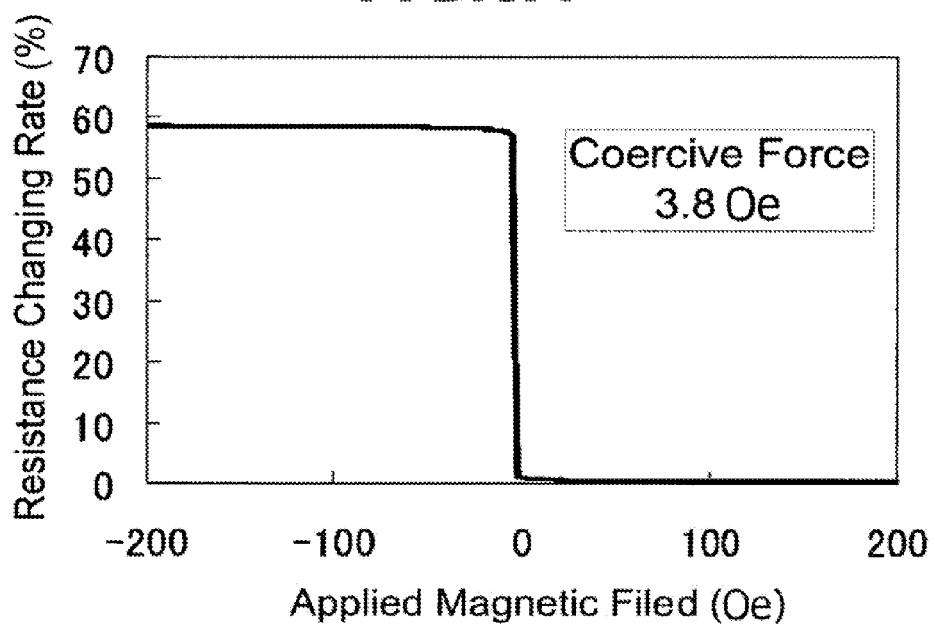
FIGS. 3A and 3B are graphs showing the relation between a resistance change rate and an applied magnetic field of tunneling magnetoresistance devices of the first embodiment and a comparative example, respectively.

FIG. 3A shows a resistance change rate of a tunneling magnetoresistance device manufactured by the method of the first embodiment. For the reference sake, a resistance change rate is also shown for a comparative example manufactured without the nitrogen plasma process shown in FIG. 2B. The tunneling magnetoresistance device of the comparative example without the plasma nitrogen process has the maximum resistance change rate of about 20%, whereas the tunneling magnetoresistance device manufactured by the first embodiment method has the maximum resistance change rate of about 60%. Since the second free layer 32 having a smaller coercive force is disposed on the first free layer 30, an effective coercive force of the free layer was 50 Oe or weaker. The advantage of disposing the second free layer 32 is apparent as compared to the coercive force of about 500 Oe of the free layer 107 of the tunneling magnetoresistance device shown in FIG. 9A.

Figure 3B:
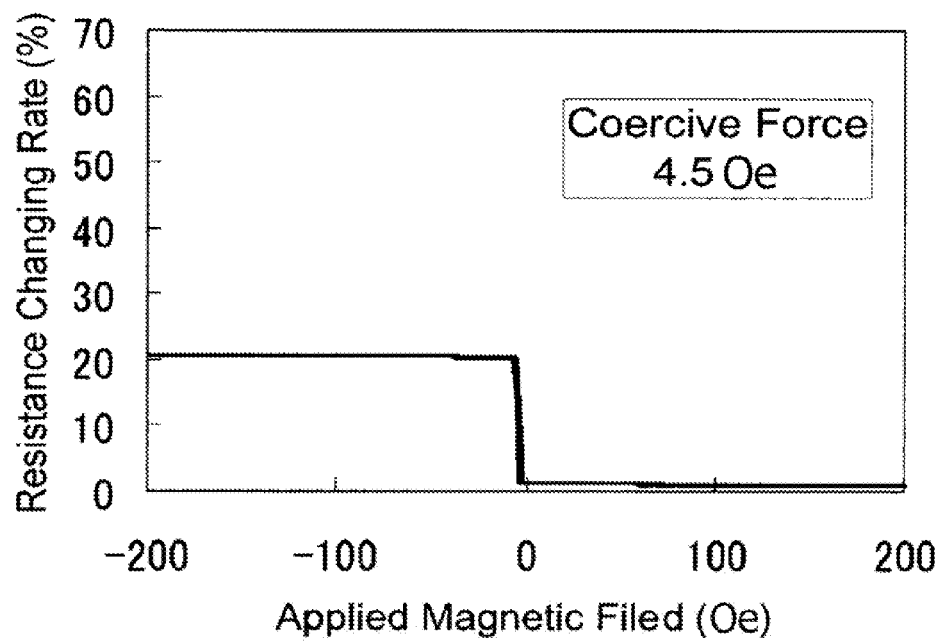

The coercive force can be made small by disposing the second free layer 32. However, if the second free layer 32 is disposed simply on the first free layer 30, the resistance change rate lowers as shown in FIG. 3B. As in the first embodiment, the resistance change rate can be maintained high by exposing the first free layer 30 to the nitrogen plasma 38 after the first free layer 30 is formed and before the second free layer 32 is formed. In the following, studies will be made on the reason why the resistance change rate can be maintained high.

Figure 4A:
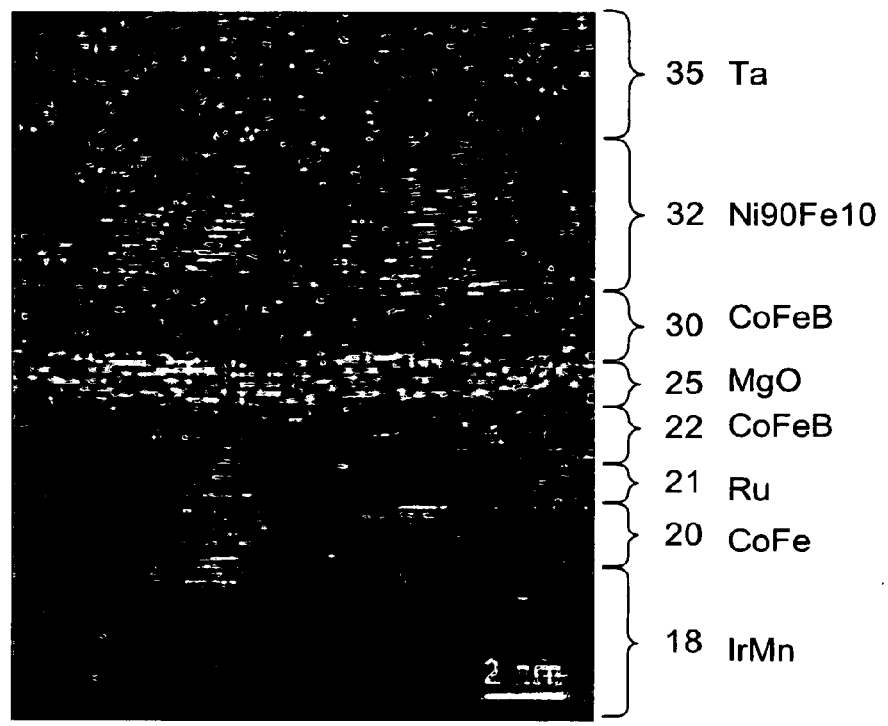
FIGS. 4A and 4B are TEM photographs in section of the tunneling magnetoresistance devices of the first embodiment and the comparative example, respectively.
Figure 4B:
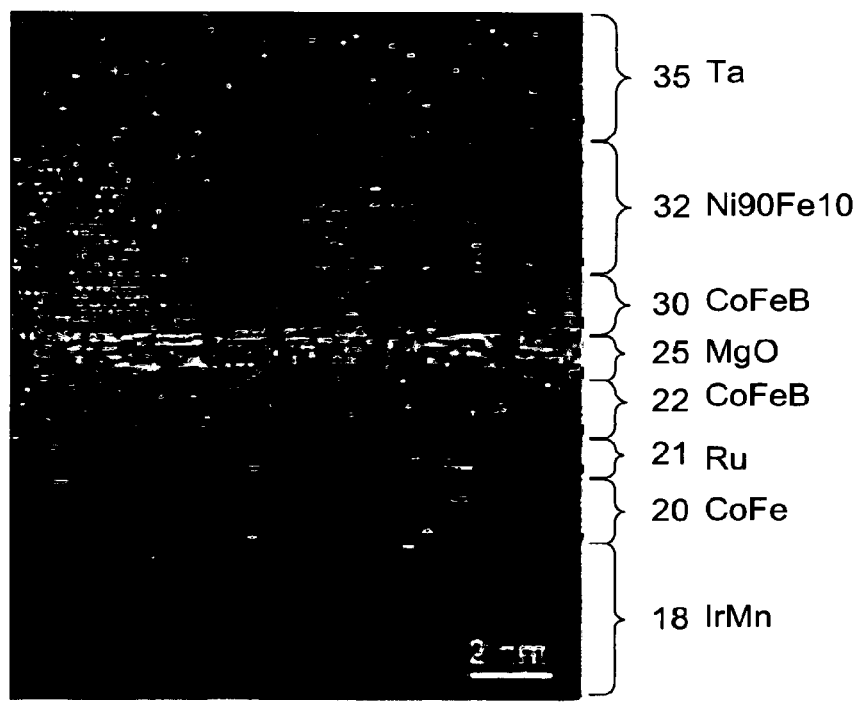

FIGS. 4A and 4B show transmission electron microscope (TEM) photographs of the cross sections of tunneling magnetoresistance devices of the first embodiment and a comparative example, respectively. In the comparative example, it can be seen from FIG. 4B that the first free layer 30 of CoFeB is polycrystallized. It can be considered that crystallization progresses from the interface between the first free layer 30 and second free layer 32 toward the inside of the first free layer 30 during the regularizing heat treatment for the pinning layer 18 and other heat treatment. Therefore, although the first free layer 30 is amorphous immediately after film formation, the first free layer 30 is crystallized by the succeeding heat treatment. It can be understood from a distance between crystallographic planes in the TEM photograph that CoFeB of the first free layer 30 has the (111) plane preferentially oriented in parallel to the substrate surface.

As shown in FIG. 4A, in the first embodiment, a crystalline structure is not observed in the first free layer 30, and the first free layer 30 is amorphous. It is known that if the ferromagnetic layer being in contact with the barrier layer 25 has the (111) orientation, the resistance change rate lowers. In the first embodiment, the resistance change rate is suppressed from lowering, by making the first free layer 30 amorphous.

It can be seen from the TEM photograph that NiFe of the second free layer 32 of the tunneling magnetoresistance device of the first embodiment has the (111) orientation. Since the second free layer 32 is not in contact with the barrier layer 25, the (111) orientation of the second free layer 32 does not cause a lowered resistance change rate.

In the first embodiment, the second free layer 32 is made of crystalline ferromagnetic material having the face centered cubic structure and the (111) orientation. After the first free layer 30 is formed, the surface thereof is subjected to the plasma process. It is therefore possible to prevent the first free layer 30 from being crystallized by inheriting the crystal structure of the second free layer 32 on the first free layer 30. Even if the orientation of crystalline grains of the second free layer 32 is random (namely the second free layer 32 has non-orientation.), it is possible to suppress the resistance change rate from being lowered, by making the first free layer 30 amorphous.

In the first embodiment, a composition ratio of Co, Fe and B constituting the first free layer 30 is set to 60 atom %, 20 atom % and 20 atom %, respectively. B is added in order to make CoFe alloy amorphous. In order to make the first free layer 30 amorphous, it is preferable to set a B concentration to 10 atom % or higher.

Generally, it is difficult to definitely distinguish amorphous state from fine crystalline state. As shown in FIG. 4B, if clear crystal lattice images can be observed in the first free layer 30, it can be defined that the first free layer 30 is crystalline. If clear crystal lattice images cannot be observed, it can be defined that the first free layer 30 is either amorphous or fine crystalline. Even if the first free layer 30 is fine crystalline, it is possible to suppress the resistance change rate from being lowered more than if the first free layer 30 is crystalline. If a sharp peak does not appear in an X-ray diffraction pattern of CoFeB constituting the first free layer 30, it can be defined that the first free layer 30 is either amorphous or fine crystalline.

A very thin region near the interface between the barrier layer 25 and first free layer 30 is crystallized in some cases. However, if most of the region of the first free layer 30 are amorphous or fine crystalline, it is possible to obtain sufficient advantages of suppressing the resistance change rate from being lowered. If a very thin crystallized region has a thickness of at most 0.5 nm, it can be defined that the first free layer 30 is amorphous or fine crystalline as a whole.

Figure 5:
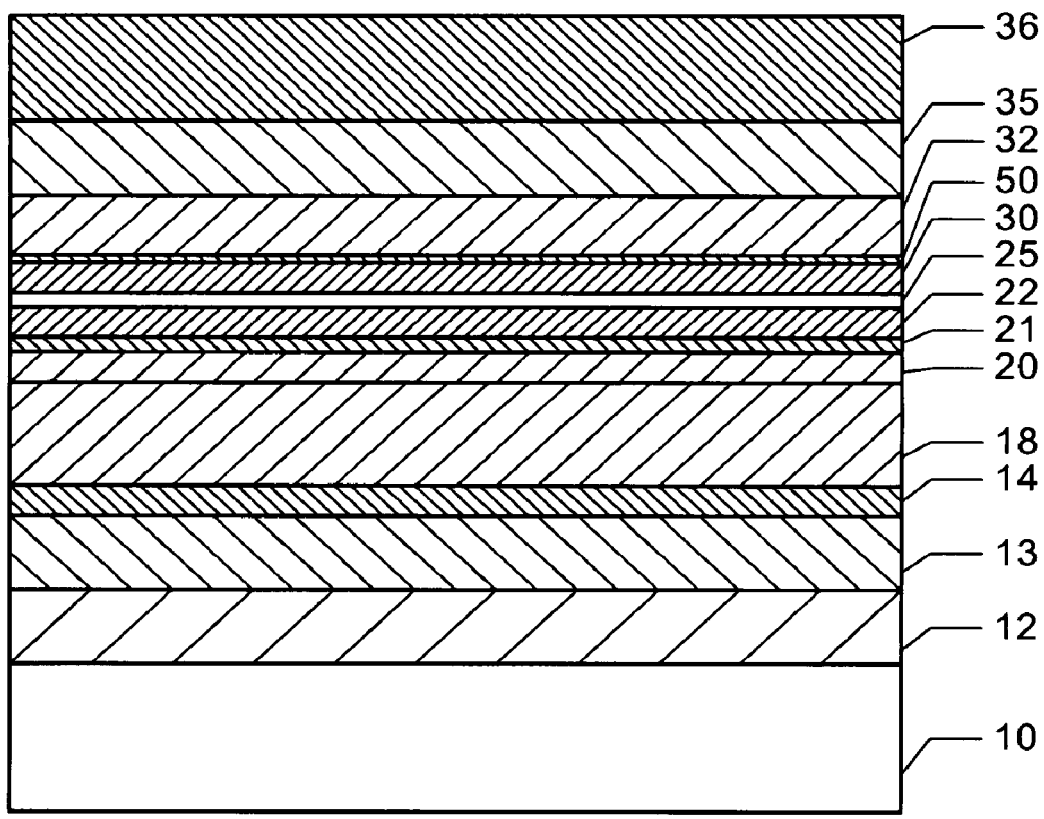
FIG. 5 is a cross sectional view of a tunneling magnetoresistance device according to a second embodiment.

FIG. 5 is a cross sectional view of a tunneling magnetoresistance device according to the second embodiment. In the second embodiment, a crystallization suppressing layer 50 is inserted between the first fee layer 30 and second free layer 32. The crystallization suppressing layer 50 is a Ta layer having a thickness of, e.g., 0.2 nm, and is formed by magnetron sputtering. In the second embodiment, the surface of the first free layer 30 is not processed by nitrogen plasma shown in FIG. 2B of the first embodiment. Other structures are the same as those of the first embodiment.

In the second embodiment, the crystallization suppressing layer 50 suppresses crystallization of the first free layer 30 during the regularizing heat treatment process for the pinning layer 18. Therefore, as in the case of the first embodiment, the first free layer 30 can be maintained in an amorphous state. In order to exchange-couple the first free layer 30 to the second free layer 32, it is preferable to set a thickness of the crystallization suppressing layer 50 to 0.5 nm or thinner. The crystallization suppressing layer 50 may be thinned to one atomic layer if the crystallization suppressing effect is ensured.

Figure 6A:
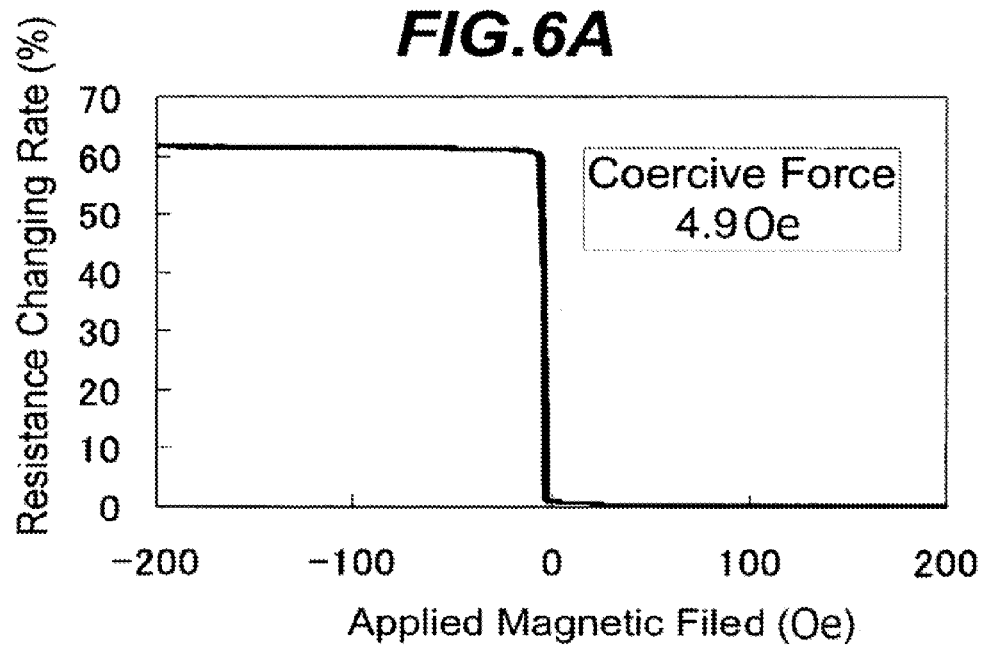
FIGS. 6A and 6B are graphs showing the relation between a resistance change rate and an applied magnetic field of tunneling magnetoresistance devices of the second embodiment and a comparative example, respectively.
Figure 6B:
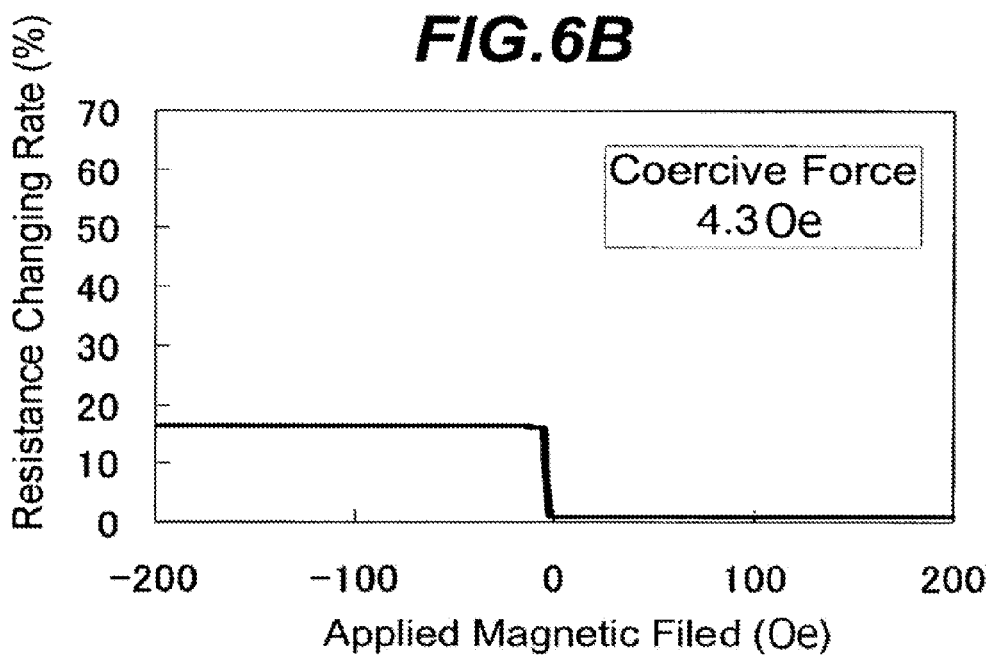

FIG. 6A shows the relation between a resistance change rate of the tunneling magnetoresistance device of the second embodiment and an applied magnetic field. For the comparison sake, FIG. 6B shows the relation between a resistance change rate of a tunneling magnetoresistance device not provided with the crystallization suppressing layer 50 and an applied magnetic field. The maximum resistance change rate of the tunneling magnetoresistance device of the second embodiment was about 62%, whereas the maximum resistance change rate of the comparative example was about 17%. Coercive forces of the tunneling magnetoresistance devices of the second embodiment and comparative example were 4.9 Oe and 4.3 Oe, respectively. It can be seen that a large resistance change rate can be obtained by disposing the crystallization suppressing layer 50.

It is possible to use as the material of the crystallization suppressing film 50, other conductive materials capable of suppressing crystallization of the first free layer 30. Hf, Zr, Pd and the like may be cited as usable material of the crystallization suppressing film 50.

Figure 7:
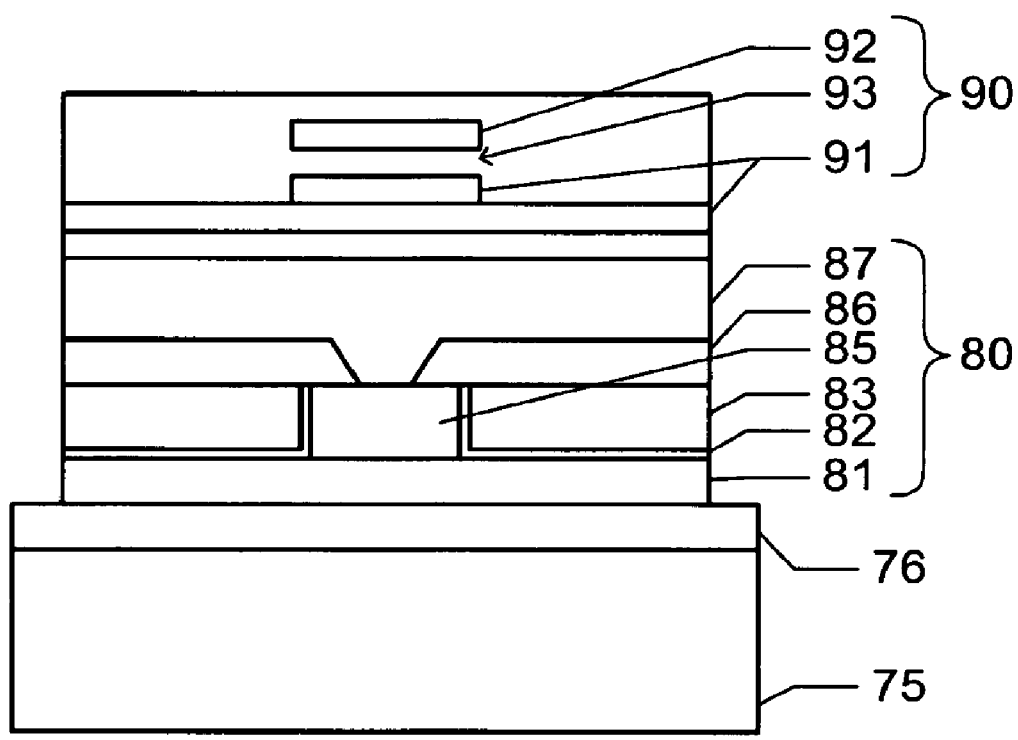
FIG. 7 is a front view of a magnetic head using the tunneling magnetoresistance device of each of the first and second embodiments.

FIG. 7 shows the main portion of the surface facing a magnetic recording medium, of a magnetic head including the tunneling magnetoresistance device of each of the first and second embodiments. An alumina film 76 is formed on a base body 75 made of $Al_2O_3$—TiC or the like. A reproducing unit 80 is disposed on the alumina film 76, and an induction type recording unit 90 is disposed on the reproducing unit 80.

The induction type recording unit 90 includes a lower magnetic pole 91, an upper magnetic pole 92 and a recording gap layer 93 disposed between the poles. The upper magnetic pole 92 has a width corresponding to a track width of the magnetic recording medium. The induction type recording unit 90 further includes a yoke (not shown) for magnetically coupling the lower magnetic pole 91 to the upper magnetic pole 92, and a coil (not shown) wound around the yoke. As a recording current flows through the coil, a recording magnetic field is induced.

The lower magnetic pole 91 and upper magnetic pole 92 are made of soft magnetic material. Material having a large saturation magnetic flux density, such as $Ni_{80}Fe_{20}$, CoZrNb, FeN, FeSiN, FeCo alloys may be preferably used as the material of the lower magnetic pole 91 and upper magnetic pole 92. The induction type recording unit 90 may be replaced by a recording unit having another structure.

Next, the structure of the reproducing unit 80 will be described. A lower electrode 81 is formed on the alumina film 76. A tunneling magnetoresistance device 85 is formed on a partial surface area of the lower electrode 81. The tunneling magnetoresistance device 85 has the same structure as that of the tunneling magnetoresistance device of the first or second embodiment.

An insulating film 82 covers the sidewall of the tunneling magnetoresistance device 85 and the surface of the lower electrode 81 continuous with the sidewall. Magnetic domain control films 83 are disposed on both sides of the tunneling magnetoresistance device 85. Each of the magnetic domain control films 83 has a lamination structure of, e.g., a Cr film and a ferromagnetic CoCrPt film stacked in this order from the lower electrode 81 side. The magnetic domain control films 83 make each of the pinned layers and free layers constituting the tunneling magnetoresistance device 85 have a single magnetic domain to thereby prevent generation of Barkhausen noises.

An alumina film 86 is formed on the tunneling magnetoresistance device 85 and magnetic domain control films 83, and an upper electrode 87 is formed on the alumina film 86. A portion of the upper electrode 87 penetrates the alumina film 86 and is electrically connected to the upper surface of the tunneling magnetoresistance device 85.

The lower electrode 81 and upper electrode 87 are made of soft magnetic alloy such as NiFe and CoFe, and has a function as a magnetic shielding function as well as a sense current flow path. A conductive film of Cu, Ta, Ti or the like may be disposed at the interface between the lower electrode 81 and tunneling magnetoresistance device 85.

The reproducing unit 80 and induction type recording unit 90 are covered with an alumina film, a carbon hydride film or the like in order to prevent corrosion and the like.

A sense current flows through the tunneling magnetoresistance device 85 in a thickness direction thereof. A change in the tunnel resistance of the tunneling magnetoresistance device 85 is detected as a voltage change.

Figure 8A:
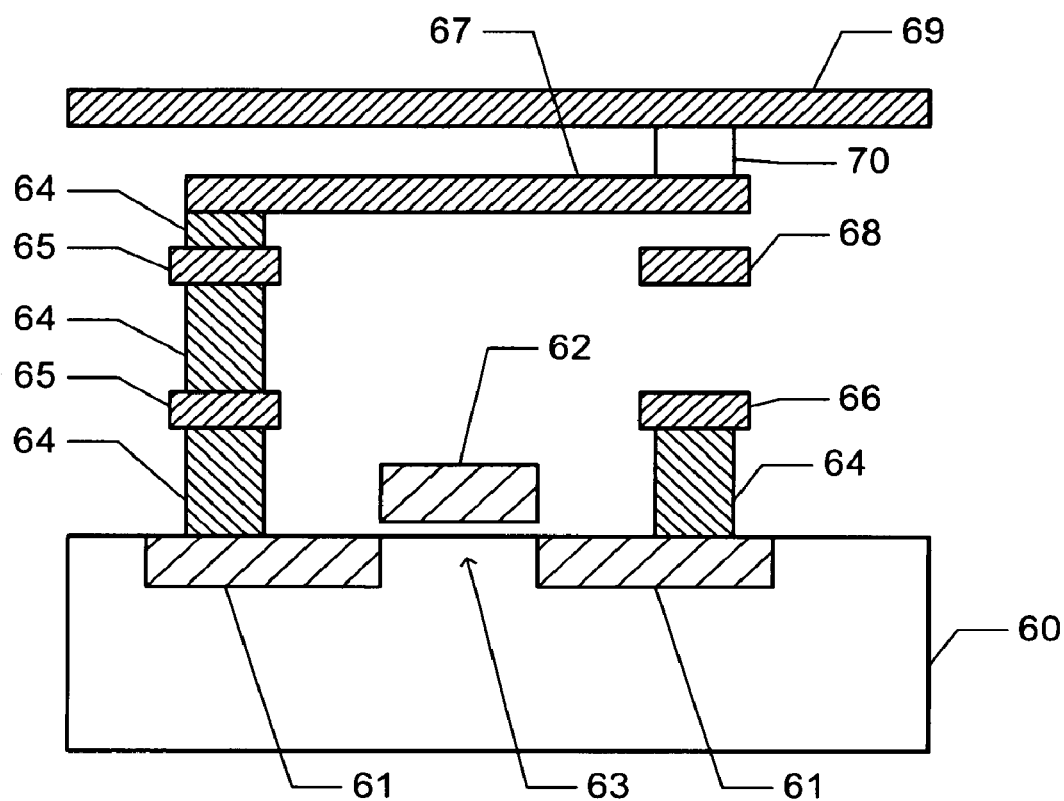
FIG. 8A is a cross sectional view of an MRAM using the tunneling magnetoresistance device of each of the first and second embodiments.
Figure 8B:
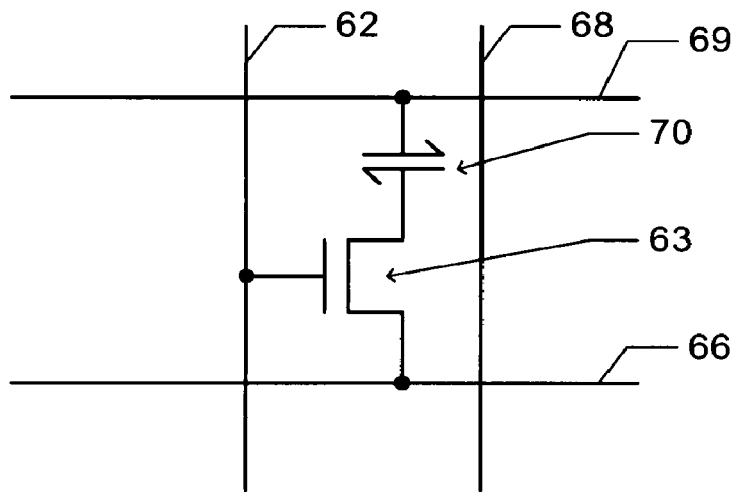
FIG. 8B is an equivalent circuit of MRAM.

FIG. 8A is a cross sectional view of a magnetic random access memory (MRAM) using the tunneling magnetoresistance device of the first or second embodiments, and FIG. 8B is an equivalent circuit of MRAM. Disposed on the surface of a silicon substrate 60 are a reproducing word line 62, a MOS transistor 63, a recording word line 68, a bit line 69 and a tunneling magnetoresistance device 70. The reproducing word line 62 and recording word line 68 are in one-to-one correspondence and extend in a first direction (a direction perpendicular to the drawing sheet surface of FIG. 8A, a vertical direction in FIG. 8B). The bit line 69 extends in a second direction (horizontal directions in FIGS. 8A and 8B) crossing the first direction.

The MOS transistor 63 is disposed at a cross point between the reproducing word line 62 and bit line 69. The reproducing word line 62 serves also as the gate electrode of the MOS transistor 63. Namely, the conduction state of the MOS transistor 63 is controlled by a voltage applied to the reproducing word line 62.

The tunneling magnetoresistance device 70 is disposed at a cross point between the recording word line 68 and bit line 69, and has the same structure as that of the tunneling magnetoresistance device of the first or second embodiment.

As a recording current flows through the recording word line 68 and bit line 69, a magnetization direction changes in the free layer of the tunneling magnetoresistance device 70 positioned at the cross point of the recording word line 68 and bit line 69. Data is written by changing the magnetization direction. In tunneling magnetoresistance devices disposed at positions different from the cross point between the recording word line 68 and bit line 69 through which the recording current flowed, data is not written because a magnetic field is not generated having an intensity sufficient for changing the magnetization direction of the free layer.

The lowermost conductive layer of the tunneling magnetoresistance device 70 is connected to one impurity diffusion region 61 of the MOS transistor 63 via a wiring 67 and a plurality of plugs 64 penetrating a multilayer wiring layer and isolated wirings 65. The uppermost conductive layer of the tunneling magnetoresistance device 70 is connected to the bit line 69. Namely, the wiring 67 and bit line 69 are used as the electrodes for applying a sense current through the tunneling magnetoresistance device 70 in the thickness direction thereof.

The other impurity diffusion region 61 of the MOS transistor 63 is connected to a plate line 66 via a plug 64. As the MOS transistor 63 is made on-state, current depending on the resistance of the tunneling magnetoresistance device 70 flows between the bit line 69 and plate line 66. By judging a magnitude of this current, data can be read.

By utilizing the same structure as that of the first or second embodiment for the tunneling magnetoresistance device 70, it is possible to lower the coercive force of the free layer and increase a current change amount. It is therefore possible to lower the recording current and retain a large margin when recorded data is reproduced.

The present invention has been described in connection with the preferred embodiments. The invention is not limited only to the above embodiments. It will be apparent to those skilled in the art that other various modifications, improvements, combinations, and the like can be made.

What are claimed are:

1. A tunneling magnetoresistance device comprising:
   a pinned layer made of ferromagnetic material having a fixed magnetization direction;
   a barrier layer disposed over the pinned layer and having a thickness allowing electrons to transmit therethrough by a tunneling phenomenon;
   a first free layer disposed over the barrier layer and made of amorphous or fine crystalline soft magnetic material which changes a magnetization direction under an external magnetic field;
   a second free layer disposed over the first free layer and made of crystalline soft magnetic material which changes a magnetization direction under an external magnetic field and being exchange-coupled to the first free layer; and
   a crystallization suppressing layer disposed between the first and second free layers, the crystallization suppressing layer preventing the first free layer from being crystallized by inheriting a crystal structure of the second free layer,
   wherein the second free layer is polycrystalline having a face centered cubic structure, and has non-orientation or has a (111) plane oriented preferentially in parallel to a substrate surface.

2. The tunneling magnetoresistance device according to claim 1, wherein the first free layer is made of the soft magnetic material of CoFe added with at least one element selected from a group consisting of B, C, Al, Si and Zr.

3. The tunneling magnetoresistance device according to claim 1, wherein the first free layer is made of CoFeB and a B concentration is 10 atom % or higher.

4. A tunneling magnetoresistance device comprising:
   a pinned layer made of ferromagnetic material having a fixed magnetization direction;
   a barrier layer disposed over the pinned layer and having a thickness allowing electrons to transmit therethrough by a tunneling phenomenon;
   a first free layer disposed over the barrier layer and made of amorphous or fine crystalline soft magnetic material which changes a magnetization direction under an external magnetic field;
   a second free layer disposed over the first free layer and made of crystalline soft magnetic material which changes a magnetization direction under an external magnetic field and being exchange-coupled to the first free layer; and
   a crystallization suppressing layer disposed between the first and second free layers, the crystallization suppressing layer preventing the first free layer from being crystallized by inheriting a crystal structure of the second free layer,
   wherein a coercive force of the second free layer is smaller than a coercive force of the first free layer.

5. A magnetic head comprising:
   a pinned layer made of ferromagnetic material having a fixed magnetization direction;
   a barrier layer disposed over the pinned layer and having a thickness allowing electrons to transmit therethrough by a tunneling phenomenon;
   a first free layer disposed over the barrier layer and made of amorphous or fine crystalline soft magnetic material which changes a magnetization direction under an external magnetic field;
   a second free layer disposed over the first free layer and made of crystalline soft magnetic material which changes a magnetization direction under an external magnetic field and being exchange-coupled to the first free layer; and
   a crystallization suppressing layer disposed between the first and second free layers, the crystallization suppressing layer preventing the first free layer from being crystallized by inheriting a crystal structure of the second free layer,
   wherein the second free layer is polycrystalline having a face centered cubic structure, and has non-orientation or has a (111) plane oriented preferentially in parallel to a substrate surface.

6. A magnetic memory comprising:
   a tunneling magnetoresistance device;
   recording means for applying a magnetic field to the tunneling magnetoresistance device to change magnetization directions of first and second free layers of the tunneling magnetoresistance device; and
   reproducing means for applying a sense current through the tunneling magnetoresistance device to detect a resistance of the tunneling magnetoresistance device,
   wherein the tunneling magnetoresistance device includes
      a pinned layer made of ferromagnetic material having a fixed magnetization direction;
      a barrier layer disposed over the pinned layer and having a thickness allowing electrons to transmit therethrough by a tunneling phenomenon;
      the first free layer disposed over the barrier layer and made of amorphous or fine crystalline soft magnetic material which changes a magnetization direction under an external magnetic field;
      the second free layer disposed over the first free layer and made of crystalline soft magnetic material which changes a magnetization direction under an external magnetic field and being exchange-coupled to the first free layer; and
      a crystallization suppressing layer disposed between the first and second free layers, the crystallization suppressing layer preventing the first free layer from being crystallized by inheriting a crystal structure of the second free layer, and
      wherein the second free layer is polycrystalline having a face centered cubic structure, and has non-orientation or has a (111) plane oriented preferentially in parallel to a substrate surface.

* * * * *